(12) United States Patent
Dragoi et al.

(10) Patent No.: US 11,282,801 B2
(45) Date of Patent: Mar. 22, 2022

(54) METHOD FOR PERMANENT CONNECTION OF TWO METAL SURFACES

(71) Applicant: EV GROUP E. THALLNER GMBH, St. Florian am Inn (AT)

(72) Inventors: Viorel Dragoi, St. Florian (AT); Markus Wimplinger, Ried im Innkreis (AT)

(73) Assignee: EV GROUP E. THALLNER GMBH, St. Florian am Inn (AT)

(*) Notice: Subject to any disclaimer, the term of this patent is extended or adjusted under 35 U.S.C. 154(b) by 0 days.

(21) Appl. No.: 15/207,772

(22) Filed: Jul. 12, 2016

(65) Prior Publication Data

US 2016/0322318 A1 Nov. 3, 2016

Related U.S. Application Data

(62) Division of application No. 13/637,781, filed as application No. PCT/EP2011/000849 on Feb. 23, 2011, now Pat. No. 9,478,518.

(30) Foreign Application Priority Data

Mar. 31, 2010 (EP) .................................. 10003568

(51) Int. Cl.
*H01L 23/00* (2006.01)
*H01L 25/065* (2006.01)
*H01L 25/00* (2006.01)

(52) U.S. Cl.
CPC .............. *H01L 24/03* (2013.01); *H01L 24/29* (2013.01); *H01L 24/83* (2013.01); *H01L 24/94* (2013.01);

(Continued)

(58) Field of Classification Search
CPC ..... H01L 24/29; H01L 24/03; H01L 25/0657; H01L 24/94; H01L 24/83;
(Continued)

(56) References Cited

U.S. PATENT DOCUMENTS

| 4,452,389 A | 6/1984 | Amin ............................. 228/203 |
| 4,706,870 A | 11/1987 | Legge ........................... 228/123 |

(Continued)

FOREIGN PATENT DOCUMENTS

| CN | 1564726 | 1/2005 | ................ B22F 1/00 |
| CN | 101295753 A | 10/2008 | ............. H01L 33/00 |

(Continued)

OTHER PUBLICATIONS

Suga, "Cu—Cu Room Temperature Bonding—Current Status of Surface Activated Bonding (SAB)—" ECS Transactions, 3(6) 155-163 (2006).*

(Continued)

*Primary Examiner* — Allen L Parker
*Assistant Examiner* — Charles N Ausar-El
(74) *Attorney, Agent, or Firm* — Kusner & Jaffe

(57) ABSTRACT

A process for the production of a permanent, electrically conductive connection between a first metal surface of a first substrate and a second metal surface of a second substrate, wherein a permanent, electrically conductive connection is produced, at least primarily, by substitution diffusion between metal ions and/or metal atoms of the two metal surfaces.

4 Claims, 1 Drawing Sheet

(52) U.S. Cl.
CPC .......... *H01L 25/0657* (2013.01); *H01L 25/50* (2013.01); *H01L 2224/0311* (2013.01); *H01L 2224/03015* (2013.01); *H01L 2224/0355* (2013.01); *H01L 2224/03848* (2013.01); *H01L 2224/29* (2013.01); *H01L 2224/29111* (2013.01); *H01L 2224/29124* (2013.01); *H01L 2224/29144* (2013.01); *H01L 2224/29147* (2013.01); *H01L 2224/29298* (2013.01); *H01L 2224/8383* (2013.01); *H01L 2224/83801* (2013.01); *H01L 2924/00013* (2013.01); *H01L 2924/0101* (2013.01); *H01L 2924/0102* (2013.01); *H01L 2924/0105* (2013.01); *H01L 2924/01005* (2013.01); *H01L 2924/01006* (2013.01); *H01L 2924/01013* (2013.01); *H01L 2924/01018* (2013.01); *H01L 2924/01029* (2013.01); *H01L 2924/0132* (2013.01); *H01L 2924/01032* (2013.01); *H01L 2924/0133* (2013.01); *H01L 2924/01047* (2013.01); *H01L 2924/01049* (2013.01); *H01L 2924/01058* (2013.01); *H01L 2924/01075* (2013.01); *H01L 2924/01078* (2013.01); *H01L 2924/01079* (2013.01); *H01L 2924/01082* (2013.01); *H01L 2924/01322* (2013.01); *H01L 2924/01327* (2013.01); *H01L 2924/14* (2013.01)

(58) Field of Classification Search
CPC ... H01L 2224/03015; H01L 2224/0311; H01L 2224/0355; H01L 2224/03848
See application file for complete search history.

(56) References Cited

U.S. PATENT DOCUMENTS

| | | | | |
|---|---|---|---|---|
| 4,774,196 | A * | 9/1988 | Blanchard | H01L 21/2007 148/DIG. 135 |
| 4,849,247 | A * | 7/1989 | Scanlon | B29C 59/16 427/455 |
| 5,374,564 | A * | 12/1994 | Bruel | H01L 21/76243 438/455 |
| 5,503,704 | A * | 4/1996 | Bower | C04B 37/001 156/272.6 |
| 5,879,761 | A * | 3/1999 | Kulesza | H01L 21/4853 156/272.8 |
| 6,108,210 | A * | 8/2000 | Chung | H01L 24/81 174/255 |
| 6,326,241 | B1 | 12/2001 | Belke, Jr. et al. | 438/118 |
| 6,335,535 | B1 * | 1/2002 | Miyake | H01J 37/32412 250/423 R |
| 6,555,414 | B1 * | 4/2003 | Vanfleteren | H01L 24/29 438/108 |
| 6,563,133 | B1 * | 5/2003 | Tong | H01L 21/02052 257/347 |
| 6,887,769 | B2 | 5/2005 | Kellar et al. | 438/455 |
| 6,962,835 | B2 * | 11/2005 | Tong | H01L 24/90 438/108 |
| 7,368,824 | B2 | 5/2008 | Hosseini et al. | 257/779 |
| 7,420,083 | B2 | 9/2008 | Havran et al. | 562/440 |
| 7,524,736 | B2 * | 4/2009 | Ottaviani | H01L 21/76254 216/35 |
| 7,811,900 | B2 | 10/2010 | Henley | |
| 7,843,055 | B2 | 11/2010 | Bauer et al. | 257/688 |
| 7,874,475 | B2 * | 1/2011 | Hosseini | H01L 24/27 228/193 |
| 7,967,185 | B2 | 6/2011 | Sato et al. | 228/234.1 |
| 8,110,480 | B2 | 2/2012 | Henley | |
| 8,304,324 | B2 | 11/2012 | Huff | 438/458 |
| 8,563,402 | B2 | 10/2013 | Henley | |
| 9,048,283 | B2 * | 6/2015 | Liu | H01L 24/74 |
| 9,953,941 | B2 * | 4/2018 | Enquist | H01L 24/80 |
| 10,325,873 | B2 * | 6/2019 | Lin | H01L 24/08 |
| 2002/0157790 | A1 * | 10/2002 | Abe | H01L 21/76254 156/334 |
| 2003/0017679 | A1 * | 1/2003 | Lee | H01L 21/2007 438/455 |
| 2003/0157782 | A1 * | 8/2003 | Kellar | H01L 24/13 438/455 |
| 2003/0201532 | A1 | 10/2003 | Riedl | 257/734 |
| 2004/0157407 | A1 | 8/2004 | Tong et al. | 438/455 |
| 2004/0169275 | A1 * | 9/2004 | Danvir | H01L 24/16 257/737 |
| 2004/0171196 | A1 * | 9/2004 | Walitzki | H01L 21/76254 438/137 |
| 2004/0173900 | A1 | 9/2004 | Chen et al. | 257/734 |
| 2004/0235266 | A1 | 11/2004 | Tong | 438/455 |
| 2004/0245648 | A1 * | 12/2004 | Nagasawa | B22F 1/0022 257/772 |
| 2005/0003664 | A1 | 1/2005 | Ramanathan et al. | |
| 2005/0048758 | A1 * | 3/2005 | Hosseini | H01L 24/83 438/614 |
| 2005/0070584 | A1 | 3/2005 | Havran et al. | 514/357 |
| 2005/0161795 | A1 * | 7/2005 | Tong | B23K 20/02 257/686 |
| 2006/0033172 | A1 * | 2/2006 | Muthukumar | H01L 24/10 257/408 |
| 2006/0270192 | A1 * | 11/2006 | Cheng | H01L 21/2007 438/459 |
| 2006/0292824 | A1 | 12/2006 | Beyne et al. | 438/455 |
| 2007/0025684 | A1 | 2/2007 | Otremba | 385/147 |
| 2007/0131734 | A1 | 6/2007 | Hosseini et al. | 228/101 |
| 2007/0148917 | A1 * | 6/2007 | Morita | H01L 21/02032 438/459 |
| 2007/0184631 | A1 * | 8/2007 | Nakamura | H01L 21/76254 438/455 |
| 2007/0186854 | A1 | 8/2007 | Singh et al. | |
| 2007/0243694 | A1 * | 10/2007 | Morita | H01L 21/76254 438/455 |
| 2007/0296073 | A1 | 12/2007 | Wu et al. | |
| 2008/0006938 | A1 * | 1/2008 | Patti | H01L 24/03 257/734 |
| 2008/0057333 | A1 | 3/2008 | Chu et al. | 428/612 |
| 2008/0061333 | A1 * | 3/2008 | Hidaka | H01L 27/11502 257/295 |
| 2008/0061452 | A1 * | 3/2008 | Nishihata | H01L 21/76254 257/798 |
| 2008/0105907 | A1 | 5/2008 | Otremba et al. | 257/288 |
| 2008/0211061 | A1 * | 9/2008 | Atwater, Jr. | H01L 21/2007 257/615 |
| 2008/0245843 | A1 | 10/2008 | Suga et al. | 228/3.1 |
| 2008/0248631 | A1 * | 10/2008 | Letertre | H01L 21/76254 438/459 |
| 2008/0293217 | A1 * | 11/2008 | Ghyselen | H01L 21/318 438/458 |
| 2009/0093106 | A1 | 4/2009 | Tomita et al. | |
| 2009/0108421 | A1 | 4/2009 | Nelle et al. | 257/669 |
| 2009/0121260 | A1 * | 5/2009 | Bernstein | H01L 29/045 257/255 |
| 2009/0134501 | A1 * | 5/2009 | Ganitzer | H01L 23/488 257/666 |
| 2009/0148690 | A1 | 6/2009 | Krasteva et al. | 428/323 |
| 2009/0160005 | A1 * | 6/2009 | Lee | H01L 27/14634 257/443 |
| 2009/0162946 | A1 | 6/2009 | Joseph | 436/528 |
| 2009/0186242 | A1 | 7/2009 | Sato et al. | 428/671 |
| 2009/0224371 | A1 * | 9/2009 | Yu | H01L 24/06 257/621 |
| 2009/0278233 | A1 * | 11/2009 | Pinnington | H01L 21/02389 257/615 |
| 2009/0286382 | A1 * | 11/2009 | Huff | C23F 4/00 438/455 |
| 2010/0255262 | A1 * | 10/2010 | Chen | B23K 20/24 428/172 |
| 2010/0279066 | A1 | 11/2010 | Bulliard et al. | 428/141 |
| 2010/0308299 | A1 | 12/2010 | Hahn | 257/9 |
| 2011/0029606 | A1 | 2/2011 | Ozawa | 709/203 |
| 2011/0101537 | A1 * | 5/2011 | Barth | H01L 21/76898 257/774 |

(56) References Cited

U.S. PATENT DOCUMENTS

| | | | |
|---|---|---|---|
| 2011/0233792 A1 | 9/2011 | Zhang et al. | ................. 257/778 |
| 2014/0239458 A1 | 8/2014 | Farooq et al. | |
| 2014/0374903 A1 | 12/2014 | Cheng et al. | ........... H01L 24/05 |

FOREIGN PATENT DOCUMENTS

| | | | | |
|---|---|---|---|---|
| DE | 102005052563 A1 | 5/2007 | ............. | H01L 21/60 |
| DE | 102005058654 A1 | 6/2007 | ............. | H01L 21/60 |
| EP | 1 002 612 A1 | 5/2000 | ............... | B23K 1/00 |
| EP | 1 748 480 A1 | 1/2007 | ............. | H01L 21/60 |
| GB | 2 300 375 | 11/1996 | ............. | B23K 35/26 |
| JP | H04-111982 A | 4/1992 | ............. | B23K 20/00 |
| JP | H08293665 | 11/1996 | ............. | H01L 21/60 |
| JP | 2002-222832 | 8/2002 | ............. | H01L 21/56 |
| JP | 2002-280417 | 9/2002 | ............. | H01L 21/60 |
| JP | 2004-025196 A | 1/2004 | ............. | B23K 20/00 |
| JP | 2004-273230 A | 9/2004 | ............. | H01R 43/02 |
| JP | 2006-517344 A | 7/2006 | ............. | H01L 21/02 |
| JP | 2009-177078 A | 8/2006 | ............. | H01L 21/60 |
| JP | 2007-506773 A | 3/2007 | ............. | A61K 31/192 |
| JP | 2007-083288 A | 4/2007 | ............. | B23K 20/00 |
| JP | 2007-090394 A | 4/2007 | ............. | B23K 20/00 |
| JP | 2007-090394 A | 4/2007 | | |
| JP | 2007-184408 | 7/2007 | ............. | H01L 21/60 |
| JP | 2008-098683 A | 4/2008 | ............. | H01L 21/60 |
| JP | 2008-294098 A | 12/2008 | ............. | H01L 21/02 |
| JP | 2009-049081 A | 3/2009 | | |
| JP | 2009490181 | 3/2009 | ............. | H01L 21/60 |
| JP | 2009-260818 A | 11/2009 | ............. | G06F 13/00 |
| JP | 2010-503239 A | 1/2010 | | |
| JP | 2010-046696 A | 3/2010 | ............. | B23K 20/00 |
| KR | 20000044540 A | 7/2000 | | |
| WO | WO 03/072288 A1 | 9/2003 | ............... | B23K 1/00 |

OTHER PUBLICATIONS

Humpston et al., "Diffusion Bonding of Gold", Gold Bulletin 1998, 31(4).*
Farrens et al., "Low Temperature Au—Au Thermal Compression Bonding of Thermally Mismatched Substrates", ECS Transactions, 16(8) 489-498 (2008).*
Coucoulas et al., "CCompliant Bonding—A New Technique for Joining Microelectronic Components", IEEE Transactions on Electron Devices, vol. ED-15, No. 9, Sep. 1968.*
Hirose et al., "A novel metal-to-metal bonding process through in-situ formation of Ag nanopartieles using Ag2O mieroparticles," International Conference on Advanced Structural and Functional Materials Design 2008, Journal of Physics: Conference Series 165 (2009).
Ghose, "Ion beam sputtering induced nanostructuring of polycrystalline metal films," J Phys.: Condens. Matter 21 (2009) 224001 (15 pages).
Townsend, "Optical effects of ion implantation," Rep. Prog. Phys. 50 (1987) 501-558.
Farrens, "Wafer and Die Bonding Technologies for 3D Integration," MRS Fall 2008 Proceedings E.
International Search Report from corresponding International Patent Application No. PCT/EP2011/000849, dated Apr. 7, 2011.
Chinese Office Action issued in corresponding Chinese Patent Application No. 201180016870.2, dated Aug. 19, 2014 (including English translation).
Office Action issued in corresponding Japanese Patent Application No. 2015-170132 dated Aug. 15, 2016.
Office Action issued in corresponding Japanese Patent Application No. 2015-170134 dated Aug. 15, 2016.
Shigetou et al., "Bumpless Interconnect of 6-μm pitch Cu Electrodes at Room Temperature," 2008 Electronic Components and Technology Conference, pp. 1405-1409.

* cited by examiner

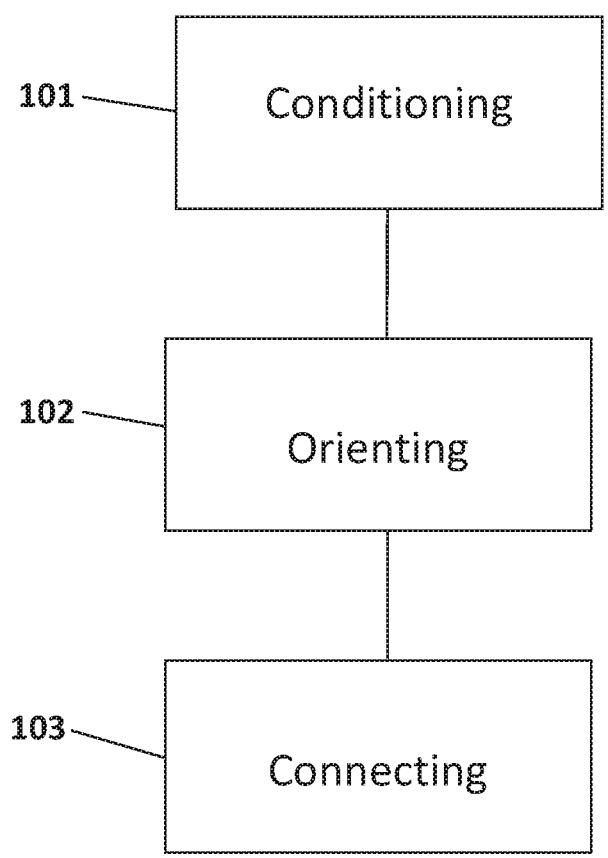

METHOD FOR PERMANENT CONNECTION OF TWO METAL SURFACES

RELATED APPLICATIONS

The present application is a divisional of U.S. application Ser. No. 13/637,781, filed Sep. 27, 2012, which is a U.S. National Stage application of International Application No. PCT/EP11/00849, filed Feb. 23, 2011, which claims priority from European Patent Application No. 10003568.2, filed Mar. 31, 2010, said patent applications hereby fully incorporated herein by reference.

FIELD OF THE INVENTION

The invention relates to a method for the production of a permanent connection between two metal surfaces.

BACKGROUND OF THE INVENTION

The production of permanent, electrically conductive, metallic connections between two metal surfaces is gaining increasing importance in the semiconductor industry. Primarily for new types of packaging technologies in the area of so-called "3D integrated devices or ICs (3D IC)," metallic bond connections between two functional planes play a decisive role. In this case, first active or passive circuits are manufactured on two independent substrates, and the latter are permanently connected to one another in a bonding step, and the electrical contacts are established. This connection step can be accomplished either by connecting two wafers (wafer to wafer—W2W), by connecting one or more chips with a wafer (chip to wafer—C2W), or by connecting one or more chips with a chip (chip to chip—C2C) method. In the case of these connection methods, direct connections between two connecting surfaces are of great interest, whereby both surfaces consist of the same material (metal) to a large extent. Here, methods that, to a large extent, do not require additional materials in this connection plane are quite especially preferred. In this connection, copper (Cu) or aluminum (Al) or gold (Au) is commonly used as metallization. It should be clarified, however, that this invention basically also operates in interaction with other metals, and the metal selection is based predominantly on requirements of chip structures and pre-conditioning steps. Therefore, different metals are also to be regarded as claimed for the invention. In addition, the method can also be used for so-called "hybrid bond interfaces." These hybrid interfaces consist of a suitable combination of metal contact surfaces, which are surrounded by non-metallic regions. In this case, the non-metallic regions are configured in such a way that in an individual connecting step, both the metallic contact as well as contacts between the non-metallic regions can be produced. At this time, these connections, which are free of foreign materials, in particular of foreign metals, are produced by a so-called diffusion-bond method. Here, the contact surfaces are oriented toward one another and are brought into contact. The contact surfaces are pretreated by means of suitable methods (for example, "Chemical Mechanical Polishing," or, in short, "CMP") in such a way that they are very flat, and they have a slight surface roughness. The contact surfaces are then pressed together in a suitable device (for example, a wafer bonder) and are heated at the same time to a freely selectable process temperature. Here, it may also prove advantageous if this takes place in an optimized atmosphere, such as, for example, a vacuum (e.g., <1 mbar, preferably <1-3 mbar) or in a reducing atmosphere, in particular an atmosphere with a high content (>1%, preferably >3%, even better >5%, and ideally >9%) on hydrogen (H2). Under these process conditions, a so-called diffusion bond is now produced between the two metal surfaces. Here, in the case of eutectic metal compositions, metal atoms or molecules diffuse back and forth between the two surfaces and thus establish a permanent, metallically conducting and mechanically extremely stable connection between the surfaces. Often, in this case, the connection is of a quality that makes detection of the original contact surfaces in the metal structure impossible. Rather, the connection is shown as a homogeneous metal structure, which now extends beyond the original contact surface. One factor, which greatly limits the use of this technology today, is the temperature that is relatively high in most cases, which is necessary to produce the connection and in particular to make the diffusion possible. In many cases, this temperature is higher than 300° C., in many cases higher than 350° C., typically 380 to 400° C., and in certain cases even up to 450 or 500° C. higher than the temperature that can be tolerated by the components (typically <260° C., in many cases <230° C., for certain components <200° C., and in certain cases <180 or even <150° C.) and therefore prevents or limits the use of this method. This invention now deals with this problem since it makes possible a method in which the necessary process temperature is reduced dramatically.

These metallic connections are now to be referred to below in this document as "authentic bond connections." In this case, bond connections are always meant in which a connection is produced between two metallic contact surfaces, consisting of a metal A, without the use of foreign material installed permanently in the connection, in particular a foreign metal B, which has a different elementary composition.

As already described above, the methods that exist at this time are limited by the necessary process temperature to make the diffusion process possible. In principle, it can be asserted that diffusion processes are actions that depend on multiple factors. However, it is such that the process at lower temperature proceeds more slowly. In practice, however, this is a problem, since this would limit the economic efficiency of such processes, or would make very drawn-out (>1 h) processes uneconomical. Therefore, the diffusion bonding processes are not applied between the same contact surfaces. As an alternative, in this case, solder joints or the most widely varied manifestations of eutectic connections and so-called intermetallic compound connection applications are used. As examples, solder joints based on lead/tin solder, copper-silver-tin solder, indium-based solders or else gold-tin or gold-silicon or aluminum-germanium, as well as copper-tin (intermetallic compound Cu3Sn) can be cited here. The disadvantage of these methods lies in problems of both manufacturing logistics and technology. In many cases, these bond connections are to be produced in an area of manufacturing where only a certain metallization (e.g., Cu) is established and qualified. In this case, it would be an immense additional expense, in addition to this metallization, to build and also to qualify the infrastructure for another metallization. From the technological aspect, eutectic connections are to be considered critical with respect to the long-term stability. Certain connections are extremely brittle, and mechanical fatigue phenomena, i.a., can result. In addition, for certain metallizations, very narrow tolerances with respect to the mixing ratio are observed to guarantee the desired properties (e.g., melt temperature, mechanical and electrical properties) of the eutectic connection. In addition, diffusion effects in connection with eutectic connections can cause problems. Thus, for example, it would be a serious problem if tin were to diffuse from one interface between two copper contact surfaces through the entire copper contact and were to reach the underlying barrier layer between the copper contact and the underlying layer. Because of the altered metal composition, this would lead to the mechanical delamination of the copper in this interface and thus result in a mechanical defect of the component, which could occur only after several years in the field. These are effects that can occur in this form only with microstructures, since here, very thin layers are used in which such effects can only play a role.

It is therefore the object of this invention to indicate a method with which a reduced process temperature and/or a reduced process time can be achieved in metallic bond connections.

This object is achieved with the features of the claims.

Advantageous further developments of the invention are indicated in the subclaims. Also, all combinations that consist of at least two of the features that are indicated in the description, the claims and/or the FIGURES fall within the scope of the invention. In the indicated ranges of values, values that lie within the above-mentioned limits are also disclosed as boundary values and can be claimed in any combination.

BRIEF DESCRIPTION OF THE DRAWING

FIG. 1 is a flowchart illustrating a process for the production of a permanent, electrically conductive connection between a first metal surface of a first substrate and a second metal surface of a second substrate, according to an embodiment of the present invention.

DETAILED DESCRIPTION OF PREFERRED EMBODIMENT

This invention now presents methods and processes by means of which the bond temperature for authentic bond connections can be reduced dramatically, and this thus makes possible the use of connections, which do not require foreign metal, for a broad area of use. An additional use of this invention is also the acceleration of the process, which can be achieved in the case of ideal, selected process parameters and which increases the economic efficiency of the process.

Diffusion can be divided in general into substitutional and interstitial diffusion.

In the substitution diffusion, the diffusion jumps of the individual atom take place along each point in the grid, on which other atoms could be located. As a result, such a diffusion jump can actually take place, if necessary, at the position to which an atom would jump but no other atom can be located (exceptions exist: direct atom exchange mechanisms, which are discussed scientifically but are not yet detected; if they exist, they occur so rarely in comparison to the other atom exchange mechanisms that they can be disregarded). The position at which no atom is located is called a void. The void is to occupy a fundamentally important aspect in the further description of the patent.

In interstitial diffusion, smaller atoms diffuse within the lattice holes of a crystal. Since we are primarily dealing with homoatomic diffusion in this patent, interstitial diffusion is not further considered.

Hydrogen, which diffuses in the lattice holes of the Si crystal grid, would be an example of interstitial diffusion. In comparison to Si, hydrogen is "small," such that it has space in the lattice holes.

According to the invention, only the substitution diffusion is suitable for the case of homoatomic diffusion of the same metal species.

In addition, surfaces, grain boundaries and volume diffusion can be distinguished. Atoms diffuse the best where they are limited by as few other atoms are possible. This state is primarily present on the surface, by which the high mobility of the atoms on the surface is also clarified. Even in the grain boundaries, an atom in general has more space than in the crystal grid itself. The speed of the diffusing species is therefore between that of the surfaces—and that of the volume diffusions. A requirement for a grain boundary diffusion is, of course, the existence of grain boundaries.

For this case of polycrystalline metal surfaces, the following problems occur with direct bonds.

First of all, polycrystalline materials consist of several grains that are oriented differently relative to the surface to be bonded. This results in that the surface consists of different crystallographic surfaces. The different physical properties of the individual grain surfaces have, in general, different oxidation, diffusion, adhesion properties, etc.

Secondly, the grains have so-called grain boundaries, i.e., atom-free areas in the angstrom to nanometer range, which separate the grains from one another, in which atoms have a higher diffusivity than in the grain volume.

Thirdly, the surfaces to be bonded in the rarest cases are free of oxidation products.

The fact that polycrystalline surfaces are present in the worst case with oxidation products and a non-zero surface roughness does not make any direct welding possible. The surfaces do not lie completely flat upon contact but rather form pores in the interface. These "microscopic holes" are not confused with the above-described voids that are of fundamental importance for the diffusion, while "microscopic holes" in the interface prevent the jump of atoms "to the other side."

In summary, it can be said that the modification of two surfaces is implemented according to the invention in such a way that at the lowest possible temperatures, the diffusion of atoms into one another has to be implemented as simply as possible.

Diffusion can be promoted, for example, by the metal surfaces that are to be connected being configured in such a way that layers that are near the surface or, ideally, one layer that starts from the surface and reaches a certain depth "d" (layer thickness) in the material is made available, and said layer has a structure that produces diffusion, in particular primarily substitution diffusion, between the surfaces that are to be connected. Below, methods are now described that make it possible to produce this layer that is near the surface. Primarily, it can prove advantageous to make available a layer that is near the surface and that is less tightly packed. It is thus meant that the void concentration is correspondingly high. These surface defects now have the advantage that in a temperature treatment, a reorganization of the structure takes place that ultimately leads to tighter packing (and an elimination of the surface defects). When this temperature step now takes place, while the two metallic contact surfaces are in close contact, the latter can be plastically deformed and thus also close empty spaces in the interface; thus, it makes possible an even better contact and promotes the development of a diffusion bond between these two surfaces. A series of variants is now provided for the conditioning of surfaces with which these layers can be produced:

Subsequent Production of Surface Defects:

With this method, the metallic contact surfaces are produced with methods that are known from the prior art.

Common process steps in this respect are the deposition of a so-called "seed layer," which is used to make possible an electrochemical deposition of metal (e.g., copper). In this case, the metallization obtains the necessary structuring (in the contact regions and non-metallic adjacent regions located around the contact regions) by means of lithography and the defining of a so-called plating mask. After the electrochemical deposition of the metal, the latter is polished in most cases by means of Chemical Mechanical Polishing (CMP) to ensure flat surfaces and a very low surface roughness (<2 nm, ideally <1 nm, even more preferably <0.5 nm root-mean-square [rms], measured by means of 2×2 µm of AFM Scan). These methods are sufficiently known in the industry. Depending on the configuration of the bond interface, the non-metallic region that lies around the metal pads can consist of silicon dioxide or an organic insulation material or other suitable materials. In this case, the topography between the metal regions and the surrounding regions can either be selected in such a way that both the metal regions and the non-metallic regions simultaneously come into contact—so that no topography is present—or alternatively, the non-metallic regions are slightly recessed compared to the metallic regions (e.g., approximately 100 A, preferably 1,000 A or 2,000 A) so that only the metallic regions come into contact with one another.

As an alternative to the electrochemical deposition of the metal, other methods such as sputtering or the like are also suitable.

Starting from a metallic contact surface that is produced with a surface quality that corresponds to a large extent to the conventional diffusion bonding method, these methods that are now suitable are subjected to incorporating subsequent surface defects.

In one embodiment, these surface defects are produced by implanting gas ions. More preferably in this respect, ions are selected that have sufficient mass to produce surface defects in the structure by "dislocation" of corresponding metal atoms or metal molecules. Gases that do not react with the metal, in particular noble gases such as argon, are to be considered as especially suitable in this respect. For certain applications, however, nitrogen or other gases with sufficient mass are also suitable. The decisive question here is the ratio of the mass of the gas ion in comparison to the mass of the metal atom. In principle, this implantation process can be achieved in any device that allows the bombardment of the metallic surfaces with gas ions. This is preferably found, however, with plasma-based systems. Preferred in this category are so-called inductively coupled plasma systems (ICP) or so-called capacitively coupled plasma systems (CCP). With both systems and in particular ICP systems, it is critical that the acceleration energy for the ions be selected correctly to achieve the desired properties of the metal layer that is near the surface. With ICP systems, this acceleration energy can be set by means of variable field strength. With CCP systems, this acceleration energy can be optimized by means of a series of variants. According to the invention, for this purpose, a self-bias voltage can be provided on the wafer receptacle, and, preferably, the latter can also be specifically set to influence the acceleration energy of the ions. It is even more ideal, however, to use a so-called "dual frequency plasma" set-up. It is thus possible to control the plasma density and temperature with one of the two frequencies, while the acceleration energy can be influenced with the second (frequency applied to the wafer receptacle). The set-up operates even more ideally when the frequency that is applied to the wafer is selected comparatively low (in comparison to the plasma systems with a 13.56 MHz operating frequency that is common to the industry). More preferably, this frequency is less than 1 MHz; better results are achieved with frequencies <500 kHz, optimal results are achieved with frequencies <200 kHz, and the best results are achieved with frequencies <50 kHz.

In a preferred embodiment, a stronger electrical field in a boundary layer (sheath) is produced with an in particular additional DC voltage, by which ions are accelerated more strongly on the substrate surface.

Especially good results are achieved when the selected gas for the plasma production consists not only of the ions for production of the surface defects, but also contains additional portions that advantageously influence the process. Here, for example, the addition of hydrogen is especially suitable since hydrogen has a reducing action and thus prevents an oxidation of the metal surface, or even can remove an already existing oxide layer. In particular, hydrogen ions, which are implanted in the metal surface, can have a permanent oxidation-preventing action that lasts for a few to several minutes (e.g., at least 1 minute, 3 minutes, or 5 to 10 minutes). Thus, an adequate time window is made available to be able, for example, to orient wafers to one another and to be able to apply the latter subsequently for bonding in a bonding chamber. The implantation with various ions can in this case be carried out in parallel to achieve more ideal requirements by, as described above, a correspondingly selected gas mixture being used, or else sequentially, by consecutive implanting steps being performed with use of various process gases. This can take place either in the same or in different process chambers.

To date, subsequent to the production of surface defects, the contacting and bonding of the surfaces takes place as usual. Only the process parameters can be matched advantageously. In particular, the bonding can now be carried out with significantly reduced process temperatures. Here, excellent results can already be achieved at temperatures <300° C. With optimized layers that are near the surface, a reduction of the temperature to <260° C., ideally to <230°, in many cases to <200° C., and in individual cases even to <180 or <160° C., is possible. As an alternative, the process window can even be selected in such a way that the process time can be reduced in the case of a somewhat higher process temperature.

Production of a Layer with Defects that is Near the Surface:

In the corresponding selection of the metal-depositing processes, it is possible to produce metal layers of inferior quality. In most cases, this is undesirable, since the electrical conductivity of these layers is only limited. This can be attributed to a sub-optimal configuration of the metal structure. This effect is used according to the invention. In this case, first the metal surfaces are produced with methods that are commonly used in the industry. Here, reference can be made to the embodiment above. Building on these layers, a very thin metal layer that is of inferior quality is now applied. Typically, the thickness of this layer is selected at <3 nm, better at <2 nm, and even more ideally, however, at <1 nm or <0.5 nm. This layer can be applied either to both contact surfaces or, as an alternative, even to only one of the surfaces. In this case, the thicknesses are then correspondingly optimized. Then, the contact surfaces are brought into contact and heated as is common practice. In this case, the surface defects are now eliminated, and a diffusion bond is produced on the contact surface between the two surfaces. The metal layer with the inferior quality in this case promotes the development of this diffusion bond. The production of this (these) layer(s) can be controlled by known process parameters on such deposition processes. The parameters that in this case influence the layer quality are known in the industry and can be seen in the pertinent literature. In most cases, here, these are deposition temperature, ambient pressure in the process chamber of the deposition system, as well as the selection of the gas and the ambient conditions, which is in the deposition chamber of the deposition system. A method that is suitable in this respect would be, for example, a sputtering process, which is performed under process conditions that are normally considered to be sub-optimal (such as, e.g., a process temperature that is too low).

As an alternative, the layer can also be produced by means of electroplating. In this case, it is conceivable first to produce the surfaces in planar form (as described above) and then to produce a thin layer (layer thicknesses, see above) by means of electroplating. Based on an optimized selection of the electroplating process (chemical composition, current values, temperature, etc.), a layer can thus be produced with the desired properties.

In terms of this invention, surface defects are of a size that in the ideal case has a value of one or more atoms, in particular <10 nm, preferably <5 nm, even more preferably <3 nm, even more preferably <1 nm, and even more preferably <0.5 nm, relative to a void in the shape of a sphere or an equivalent shape.

Application of Metallic Nanoparticles:

It is already known from scientific literature that metal particles (e.g., gold, but also copper) with a size of <100 nm, ideally <70 nm, even better <50 to 30 nm, and preferably <20 or <10 nm, have the property of connecting to a homogeneous continuous metal structure in a heat treatment at temperatures below the melting point depending on the size of the particles but also far below the melting point. This property can now be used for bonding processes by such particles being applied in the form of a thin layer on one or both metallic contact surfaces. The contact surfaces are then brought into contact and subjected to the heat treatment. During this heat treatment, these nanoparticles make possible both the bonding below one another and the bonding with the metallic contact surfaces, and as an end result, a complete bonding of the two metallic contact surfaces with one another. This is made possible in that the nanoparticles are very reactive on their own and have the property of ideally connecting with metal surfaces, in particular consisting of the same metal. With use of small particles, this connection can be carried out even at temperatures <250° C., ideally <200° C., even more preferably <150° C., and even <120° C. in cases with very small particles.

Optimization of Surface Roughness

A similar acceleration of the diffusion bond and a bonding in particular at greatly reduced temperature is also another possibility to correspondingly optimize the surfaces with respect to surface roughness. The basic principle consists in the planarization of the surface waviness and micro-roughness. The root-mean-square (RMS) roughness is to lie within the nanometer range. The roughness that is set has to be homogeneous. This means that the mean wavelength, as well as the mean amplitude of the ridge-valley profile, which is measured with an atomic-force microscope (AFM), has to be the same on the entire surface. This is a necessary requirement in that the surfaces can engage over one another upon contact in such a way that the ridges of one surface fill the valleys of the other surface and vice versa. Based on this optimal contact, the development of a diffusion bond is greatly promoted and is made possible even at lower temperatures.

The surface roughness that is necessary in this respect can be achieved by specifically selected CMP processes. On the one hand, CMP processes make possible the production of a very flat surface, while the surface roughness can also be influenced with the suitable selection of slurries. The production of the desired surface composition can in this case be carried out either in an individual CMP step or in two steps that follow one another. In this case, the first step is used to ensure the planarity of the surfaces, while the second step is used to produce the desired local surface roughness. Optionally, surface roughness can also be produced by means of a special etching step. In addition, it is conceivable to produce the required roughness with an interaction between electroplating and CMP or as a result of a specifically performed electroplating step. In this case, it is conceivable first to produce the surfaces in planar form and then to produce a thin layer (layer thicknesses, see variant production of a layer with defects that is near the surface) by means of electroplating. Based on an optimized selection of the electroplating process (chemical composition, current values, temperature, etc.), a layer with the desired properties can thus be produced.

The surface roughness (measured with AFM for a 2×2 μm surface) should be <20 nm, in particular <10 nm, preferably <5 nm, even more preferably <3 nm, even more preferably <1 nm, and even more preferably <0.5 nm.

To be able to achieve especially optimized process results, the above-described variants can also be combined with one another as desired. Primarily, an implanting of hydrogen as a measure to avoid oxidation in the interaction with the other described methods can yield especially optimized results.

It can be mentioned here one more time that the method also can be applied to so-called "hybrid bond interfaces." These hybrid interfaces consist of a suitable combination of metallic contact surfaces, which are surrounded by non-metallic regions. In this case, the non-metallic regions are configured in such a way that in an individual bonding step, both the metallic contact and contacts between the non-metallic regions can be produced.

Here, it can be especially advantageous to configure the plasma implanting step in such a way that both the metallic connection at low temperature and the connection between the non-metallic areas that adjoin the metallic regions can be produced. In this case, these non-metallic areas could consist of silicon dioxide, which also can be modified by means of plasma treatment in such a way that the bonding can take place at very low temperatures.

The invention consists in particular in a process flow 100, illustrated in FIG. 1, for the production of a permanent, electrically conductive connection between a first metal surface of a first substrate and a second metal surface of a second substrate with the following method steps, in particular the course of the method:

Conditioning (step 101) of the first and second metal surfaces in such a way that in a connection of the metal surfaces, in particular in a time period of a few minutes after the conditioning, a permanent, electrically conductive connection—produced at least primarily by substitution diffusion between in particular similar, preferably identical metal ions and/or metal atoms of the two metal surfaces—can be produced (step 103), Orientation (step 102) and connection (step 103) of the first and second metal surfaces, whereby during the conditioning, orientation and connection, a process temperature of at most 300° C., in particular at most 260° C., preferably 230° C., even more preferably 200° C., especially preferably at most 180° C., and ideally at most 160° C., is not exceeded.

Having described the invention, the following is claimed:

1. A process for forming a permanent, electrically conductive connection between metallic contact surfaces of a first substrate and metallic contact surfaces of a second substrate, the process comprising:
    conditioning the metallic contact surfaces of the first substrate and the metallic contact surfaces of the second substrate to promote diffusion of metal atoms between the metallic contact surfaces of the first substrate and the metallic contact surfaces of the second substrate when the metallic contact surfaces of the first substrate are brought into contact with the metallic contact surfaces of the second substrate, the conditioning comprising bombarding the metallic contact surfaces of the first substrate and the metallic contact surfaces of the second substrate with gas ions;
    aligning the metallic contact surfaces and non-metallic regions of the first substrate with the metallic contact surfaces and non-metallic regions of the second substrate, the non-metallic regions of the first substrate surrounding the metallic contact surfaces of the first substrate, the non-metallic regions of the second substrate surrounding the metallic contact surfaces of the second substrate; and
    bringing the metallic contact surfaces and the non-metallic regions of the first substrate into respective contact with the metallic contact surfaces and the non-metallic regions of the second substrate; and
    after the bringing into the respective contact, bonding the metallic contact surfaces of the first substrate to the metallic contact surfaces of the second substrate and the non-metallic regions of the first substrate to the non-metallic regions of the second substrate, the bonding comprising treating the metallic contact surfaces of the first substrate and the metallic contact surfaces of the second substrate with a process temperature that is less than 300° C. to promote diffusion of metal atoms between the metallic contact surfaces of the first substrate and the metallic contact surfaces of the second substrate and reorganization of the metallic contact surfaces of the first substrate and the metallic contact surfaces of the second substrate such that surface defects produced by the bombarding in respective layers near the metallic contact surfaces of the first substrate and the metallic contact surfaces of the second substrate are eliminated to form the permanent, electrically conductive connection between the metallic contact surfaces of the first substrate and the metallic contact surfaces of the second substrate.

2. The process according to claim 1, wherein the gas ions are hydrogen ions.

3. The process according to claim 1, wherein the metallic contact surfaces of the first substrate are brought into contact with the metallic contact surfaces of the second substrate at the same time as the non-metallic regions of the first substrate are brought into contact with the non-metallic regions of the second substrate to initiate the grain boundary diffusion.

4. The process according to claim 1, wherein, during the conditioning, aligning, bringing into contact, and bonding, the process temperature is less than 300° C.

* * * * *